US006040618A

United States Patent [19]
Akram

[11] Patent Number: 6,040,618
[45] Date of Patent: *Mar. 21, 2000

[54] MULTI-CHIP MODULE EMPLOYING A CARRIER SUBSTRATE WITH MICROMACHINED ALIGNMENT STRUCTURES AND METHOD OF FORMING

[75] Inventor: Salman Akram, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/812,476

[22] Filed: Mar. 6, 1997

[51] Int. Cl.⁷ ...................... H01L 27/082; H01L 27/102; H01L 29/70; H01L 31/11
[52] U.S. Cl. .......................... 257/586; 257/623; 257/618
[58] Field of Search .................................. 257/586, 622, 257/623, 778, 779, 737, 738, 618

[56] References Cited

U.S. PATENT DOCUMENTS

| | | | |
|---|---|---|---|
| 3,379,937 | 4/1968 | Shepherd | 257/778 |
| 3,508,118 | 4/1970 | Merrin et al. | 257/777 |
| 3,974,515 | 8/1976 | Ipri et al. | 257/353 |
| 4,290,079 | 9/1981 | Carpenter et al. | 257/779 |
| 4,376,287 | 3/1983 | Sechi | 257/668 |
| 4,649,627 | 3/1987 | Abernathey et al. | 438/153 |
| 4,670,770 | 6/1987 | Tai | 257/622 |
| 4,680,610 | 7/1987 | Pammer | 257/737 |
| 4,837,609 | 6/1989 | Gurvitch et al. | 357/71 |
| 4,840,302 | 6/1989 | Gardner et al. | 257/764 |
| 4,948,754 | 8/1990 | Kondo et al. | 438/613 |
| 5,003,357 | 3/1991 | Kim et al. | 257/622 |
| 5,006,792 | 4/1991 | Malhi et al. | 257/778 |
| 5,214,308 | 5/1993 | Nishiguchi et al. | 257/778 |
| 5,326,428 | 7/1994 | Farnworth et al. | 324/724 |
| 5,329,423 | 7/1994 | Scholz | 361/760 |
| 5,352,629 | 10/1994 | Paik et al. | 257/779 |
| 5,376,584 | 12/1994 | Agarwala | 438/614 |
| 5,468,995 | 11/1995 | Higgins, III | 257/697 |
| 5,478,779 | 12/1995 | Akram | 438/652 |
| 5,483,741 | 1/1996 | Akram et al. | 438/614 |
| 5,534,465 | 7/1996 | Frye et al. | 438/108 |
| 5,559,444 | 9/1996 | Farnworth et al. | 257/777 |
| 5,591,941 | 1/1997 | Acocella et al. | 174/266 |
| 5,598,036 | 1/1997 | Ho | 257/738 |
| 5,686,317 | 11/1997 | Akram et al. | 437/8 |
| 5,712,192 | 1/1998 | Lewis et al. | 438/108 |
| 5,754,408 | 5/1998 | Derouiche | 257/686 |
| 5,817,540 | 10/1998 | Wark | 438/107 |
| 5,877,556 | 3/1999 | Jeng et al. | 257/737 |

Primary Examiner—Olik Chaudhuri
Assistant Examiner—Phat X. Cao
Attorney, Agent, or Firm—Trask, Britt & Rossa

[57] ABSTRACT

A micromachined insulative carrier substrate preferably formed of silicon and a multi-chip module formed from the micromachined substrate. The micromachined substrate is fabricated by forming mesas across the surface of the substrate, forming an insulating layer on the substrate, and forming conductive traces on the insulating layer to route signals between semiconductor dice and/or to external circuitry. A variety of semiconductor dice and/or integrated circuitry-bearing wafer configurations (collectively, "semiconductor elements") may be attached to the semiconductor substrate. Electrical contact between the carrier substrate and semiconductor element is achieved with conductive connectors formed on either the semiconductor element or the carrier substrate. The conductive connectors each preferably make contact with both a portion of the conductive trace extending down the sidewall of the mesa and a portion of the conductive trace on the substrate between the mesas to form a more effective bond. The present invention also includes a stacked configuration. After attachment of semiconductor elements, the carrier substrates can be stacked to form a high density stacked configuration.

35 Claims, 17 Drawing Sheets

MULTI-CHIP MODULE EMPLOYING A CARRIER SUBSTRATE WITH MICROMACHINED ALIGNMENT STRUCTURES AND METHOD OF FORMING

BACKGROUND OF THE INVENTION

1. Field of the Invention

The present invention relates to the formation of a conductor trace-bearing carrier substrate from semiconductor material and the fabrication of a multi-chip module ("MCM") from the substrate. More particularly, the present invention relates to forming the semiconductor carrier substrate as a segment of a micromachined silicon wafer and fabricating the MCM therefrom.

2. State of the Art

Chip On Board ("COB") techniques are used to attach semiconductor dice to a printed circuit board, including flip chip attachment, wirebonding, and tape automated bonding ("TAB"). Flip chip attachment consists of attaching a "flip chip" to a printed circuit board or other substrate. A flip chip is a semiconductor chip that has a pattern or array of terminations spaced around an active surface of the flip chip for face-down mounting of the flip chip to a substrate. Generally, the flip chip active surface has one of the following electrical connectors: Ball Grid Array ("BGA")—wherein an array of minute solder balls or other conductive material elements is disposed on the electrical connection locations on the active surface of a flip chip that attaches to the substrate, or Slightly Larger than Integrated Circuit Carrier ("SLICC")—which is similar to a BGA, but having a smaller solder ball/conductive material element pitch (spacing) and diameter than a BGA.

Flip chip attachment requires (in the case of solder ball connections) the formation of solder-joinable contact sites or terminals on the metal conductors of a carrier substrate such as a printed circuit board ("PCB"), which sites are a mirror-image of the solder ball arrangement on the flip chip. The terminals on the substrate are usually surrounded by non-wettable barriers so that when the solder balls of the bond pads are placed in contact with the chip contact sites to melt and merge ("reflow"), surface tension holds the semiconductor chip by solder columns, suspending it above the substrate. After cooling, the chip is essentially brazed face-down to the carrier substrate by these very small, closely-spaced solder column interconnections. An insulative underfill encapsulant such as an epoxy is then generally disposed between the semiconductor die and the substrate for environmental protection and to enhance the attachment of the die to the substrate.

Higher performance, lower cost, increased miniaturization of components, and greater packaging density of integrated circuits are ongoing goals of the computer industry. To meet these challenges, attention has been directed to wafer level packaging. U.S. Pat. No. 4,670,770 issued Jun. 2, 1987 to Tai ("the '770 patent") illustrates wafer level integrated circuits formed by placing "flipped" semiconductor chips on a wafer substrate. The wafer substrate carries solder metal contacts for attaching to metallic contacts on the semiconductor chips. However, the '770 patent requires specialized metallic contacts on the semiconductor chips to make contact with the solder metal contacts on the wafer substrate. These specialized contacts increase the cost of manufacturing the assembly because of the additional fabrication steps required.

Silicon wafers have also been used as carrier substrates for temporary electrical connection with an unpackaged semiconductor die for testing, such as disclosed in commonly-owned U.S. Pat. Nos. 5,326,428, 5,478,779, 5,483,741, 5,559,444, and U.S. patent application Ser. No. 08/387,687, each hereby incorporated herein by reference. The patents and application generally disclose raised contact members with sloped walls formed on a silicon wafer by an anisotropic etch process. The raised contact members have one or more projections at their outer ends adapted to penetrate contact locations (bond pads) on the semiconductor die under test and to pierce any residual oxide or other insulating material on the surface of the semiconductor die bond pads to establish an ohmic connection therewith. However, as these projections penetrate the surface of the die bond pads on the semiconductor die under test to ensure good electrical connection, such penetration may, in some instances, degrade the physical integrity of the bond pad, or might pierce right through the bond pads, making physical contact to the devices underneath, damaging and destroying them.

None of the prior art uses of wafers in wafer level semiconductor die packaging and testing as described above teach a cost efficient method of forming a wafer level carrier substrate which can be used for packaging or testing of semiconductor dice, and that does not require any specialized processing steps or which will not damage the bond pads of the semiconductor chip. Furthermore, these prior art techniques address only temporary connection between the bond pads and the substrate. Therefore, it would be advantageous to develop a technique for forming a carrier substrate from a silicon wafer which would achieve these goals while utilizing known semiconductor device fabrication techniques.

SUMMARY OF THE INVENTION

The present invention enables semiconductor packaging at a wafer level by forming an MCM from a micromachined carrier substrate, preferably of silicon. The formation of the micromachined substrate begins with providing a substrate of semiconductor material such as monocrystalline silicon (traditional wafer), silicon-on-glass, or silicon-on-sapphire, germanium, or ceramic, which is coated on one surface with a masking material, such as a layer of silicon nitride ($Si_3N_4$). The mask material is selectively etched to form strips across the surface of the substrate. The substrate is then etched except under the protective mask strips to form elongated mesas having sidewalls extending to a lower substrate surface. It is, of course, understood that groups of the strips may be placed in mutually transverse orientation to form "box canyons" of mesas adapted to receive a semiconductor chip with bond pads arrayed about the periphery of its active surface.

After mesa formation, the remaining mask material is removed, preferably using a wet etch. An insulating or dielectric layer is then formed on the substrate, including the elongated mesas and sidewalls. The insulating layer is preferably formed by oxidizing the substrate and may be accomplished by exposing the substrate to an oxidizing atmosphere in a reaction chamber. Other insulating techniques include deposition of silicon dioxide or silicon nitride by chemical vapor deposition (CVD), and injecting TEOS (tetraethyl-orthosilane) into the reaction chamber to grow silicon dioxide ($SiO_2$) at a temperature of about 400° C. Silicon dioxide is preferred due to its low dielectric constant, which results in reduced capacitance and increased signal speed on the substrate traces. Other dielectrics such as silicon nitride can also be employed.

A conductive material layer is then formed on the insulating layer. The conductive material layer can be any known low-resistivity material such as a metal, preferably copper. The conductive material layer is then patterned and etched to form or define conductive traces on the dielectric-covered substrate surface. The conductive traces can be patterned to route signals between semiconductor dice carried on the substrate and/or to circuitry external to the substrate. A stack of conductive materials such as copper-coated palladium can also be used.

It is understood that the conductive traces can be formed by a number of alternate conventional techniques other than patterning and etching a metal layer discussed above, such as: depositing a conductive paste on the substrate by silk screening the conductive traces directly thereon; directly extruding a conductive paste to form the conductive traces; or applying a second insulating layer on the first insulating layer, etching a trough in the second insulating layer, filling the trough with a conductive material, and removing the excess conductive material. The conductive traces are preferably formed in the vicinity of chip-mounting sites to include a portion which extends to and over a mesa defining a chip site, down the sidewall and onto a lower, previously-etched portion of the substrate where a chip is to be mounted.

The forming of the conductive traces on a semiconductor substrate devoid of any integrated circuitry enables the conductive traces to be made of copper or any other low resistivity material, because such a substrate can be processed at extremely elevated temperatures (as high as 1000° C.) since the substrate does not contain any temperature sensitive integrated circuitry. Substrates containing such integrated circuitry are limited to upper temperatures ranging from about 500 to 700° C.

Once the conductive traces are formed on the substrate, they may be brought into input/output communication with external circuitry along a substrate edge with wirebonds, leads, clips, TAB tape attachment, or other connectors known in the art.

Optionally, a passivation layer may be applied over the substrate and conductive traces, which layer is then selectively etched to expose only discrete contact areas on the conductive traces.

When the completed semiconductor carrier substrate comprises an entire wafer, it can be used as a burn-in test substrate. Thus, an integrated circuitry-carrying (IC) wafer with electric contact points corresponding to the conductive traces on the completed semiconductor substrate allows for the testing of the entire circuitry-carrying wafer through burn-in without the need for preliminary dicing of the IC wafer into individual dice for testing. When performing such a burn-in test, it is preferable that the coefficient of thermal expansion (CTE) for the carrier substrate be the same or about the same as that of the IC wafer. Thus, a micromachined silicon carrier substrate is an ideal test bed for a silicon integrated circuit wafer.

A variety of semiconductor dice and/or circuitry-carrying wafer configurations (collectively, "semiconductor elements") may be attached to the silicon carrier substrate. In general, a standard bond pad array on the semiconductor die, such as a central row or rows, parallel side rows, rectangular periphery arrangement, or combinations thereof, with a conventional bond pad pitch of about 2–3 mils or 75–150 microns, can be used in the present invention. However, if necessary to prevent potential shorting, the bond pad arrangement on the active surface of the die can be rerouted to achieve a sufficiently greater pitch for use with the present invention, although such rerouting is undesirable from a cost standpoint. Furthermore, if the carrier substrate and integrated circuitry-bearing wafer each comprise entire wafers, dicing of these wafers into individual packages for use in a computer system may not be necessary.

Electrical contact between the carrier substrate and semiconductor element is achieved with conductive connectors formed on either the semiconductor element, the carrier substrate, or both (although not preferred as incurring extra cost). The conductive connectors each preferably make contact with both the portion of the conductive trace extending down the mesa sidewall adjacent a chip mounting site and the portion of the conductive trace on the etched portion of the substrate at the site itself. This enhanced, even substantially doubled, contact surface area results in the following advantages:

1. The bond has a lower contact resistance.
2. The bond is more robust than single contact (conventional flat terminal) attachment to the carrier substrate.
3. The bond is stronger, and thus mechanically more reliable.
4. An underfill material may not be required to strengthen the chip-to-substrate attachment.
5. The mesa sidewall acts at least as a rough alignment guide in at least one X-Y direction. When the conductive connectors are solder balls, reflowing the solder achieves an automatic fine alignment due to wetting of the conductive traces carried on the mesa sidewalls.

If parallel, elongated mesas are closely spaced to accommodate the width of a single connector such as a solder ball, the conductive connectors may even make contact with a trace portion extending down a sidewall, a contiguous second portion lying flat on the etched portion of the substrate, and a contiguous third portion extending up a sidewall of an adjacent mesa. This "triple" surface area contact achieves all of the above advantages for the "double" surface area contact, as well as providing an even stronger bond.

The semiconductor element, such as a large, single semiconductor die or a larger circuitry-bearing substrate such as a wafer or partial wafer, may also straddle the mesa(s) to make electrical contact with various conductive traces placed "outside" of the mesas. Additionally, the conductive connectors on the semiconductor element may be angled to form a matched angular attachment to both the substrate and mesa sidewall portions of the conductive traces. This feature may be employed with non-solder conductive elements such as conductive epoxies or conductor-filled epoxies, as well as with solder conductive connectors wherein a single reflow is employed for attachment of a semiconductor element to substrate traces.

The present invention also includes a stacked configuration of semiconductor elements and carrier substrates. After attachment of semiconductor elements, the resulting semiconductor carrier substrate assemblies can be stacked to form a high density stacked configuration.

An advantage of the present invention is that the carrier substrates of the invention are particularly adapted to the use of "partial" memories. Partials are individual semiconductor memory dice which do not yield the design or expected number of bits, such as when a 64 MB memory die as a DRAM yields only, for example, 37 MB. Rather than scrapping of such partials, conductive traces or bit lines can be connected to two or more such "partial" dice to form a larger array of usable memory. This process using the inventive substrate makes use of the lower-yielding, less desirable partials, thereby increasing the overall wafer yield. Furthermore, this bit line process for using partials can also be used for full-capacity memory dice. For example, 120 or more memory dice (or equivalent partial wafer segments) of 16 MB each could result in a multi-gigabit memory array usable in lieu of a hard disk drive in a computer.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
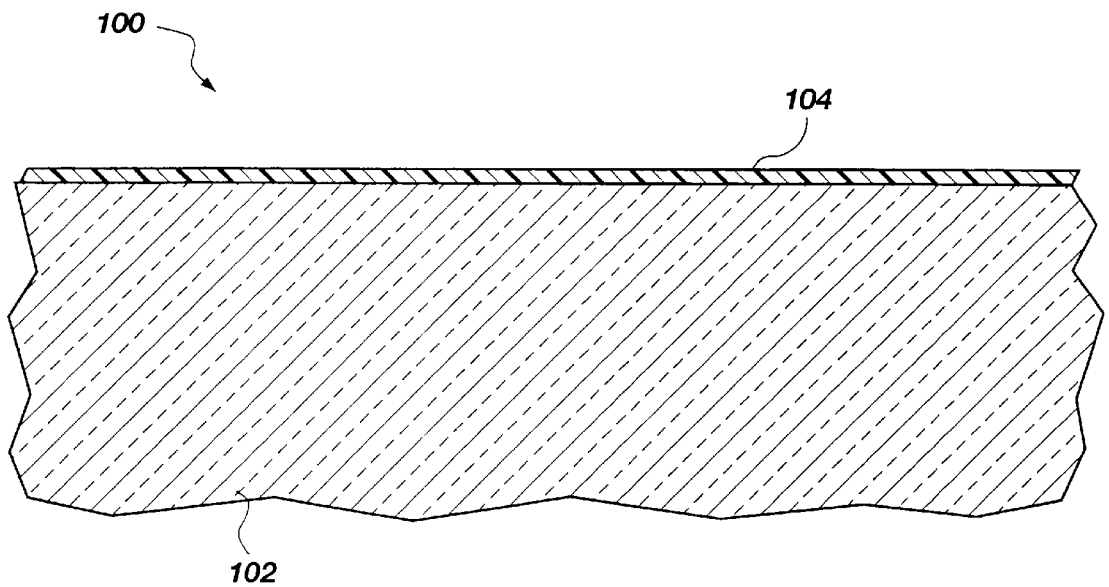
FIG. 1 is a side cross-sectional view of a mask coated substrate.

FIG. 1 illustrates a mask coated carrier substrate 100. The mask coated substrate 100 comprises a substrate 102 (such as monocrystalline silicon, silicon-on-glass, silicon-on-sapphire, germanium, or ceramic) coated with a mask layer 104, such as silicon nitride ($Si_3N_4$). While a semiconductor material substrate is currently preferred, other materials from which a substrate may be fabricated according to the present invention are equally suitable, subject to some limitations. For example, a carrier substrate 102 is preferably formed from a material having a coefficient of thermal expansion (CTE) that closely matches the CTE of the semiconductor die and/or other circuitry-bearing substrate (not shown) to be later attached to the completed carrier substrate.

Figure 2:
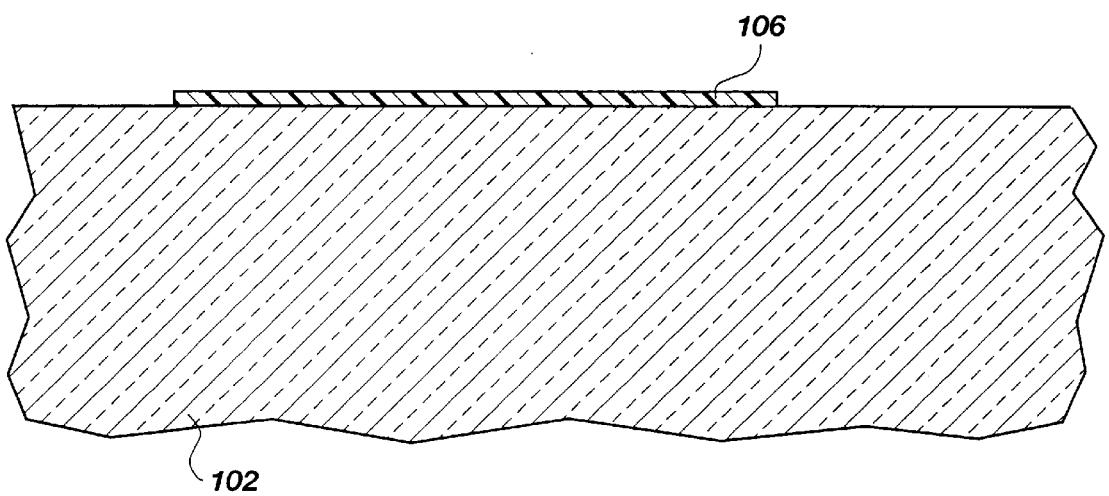
FIG. 2 is a side cross-sectional view of the mask coated substrate of FIG. 1 having a portion of the coating removed to expose strips of the substrate.
Figure 3:
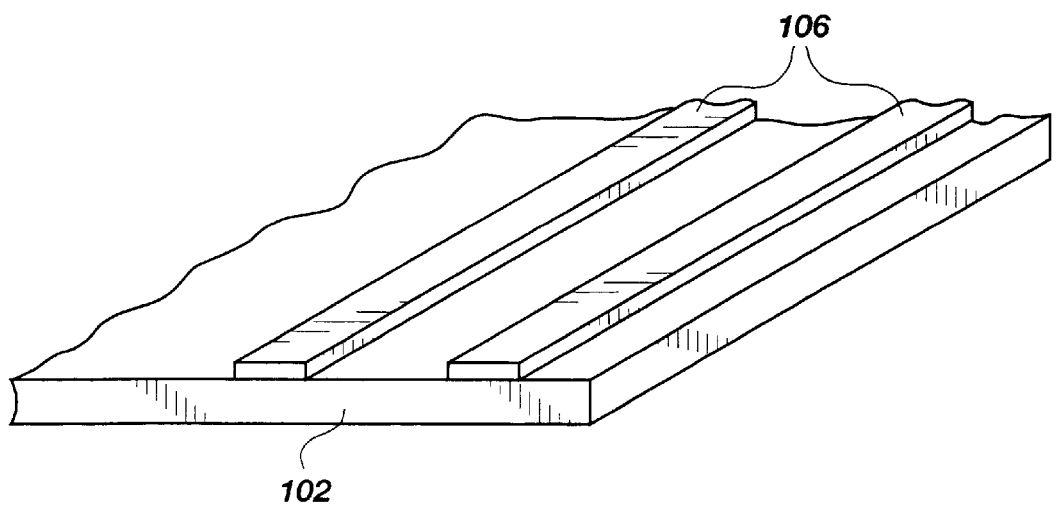
FIG. 3 is an oblique view of the exposed substrate of FIG. 2.
Figure 4:
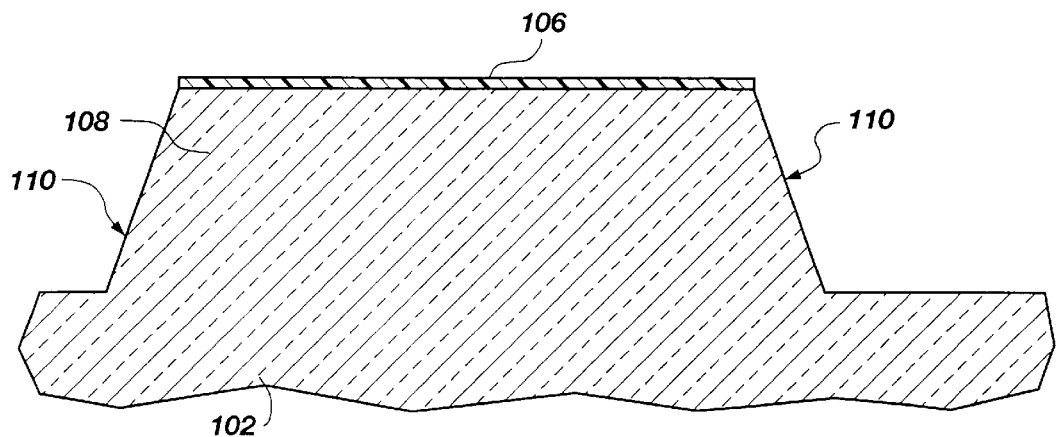
FIG. 4 is a side cross-sectional view of the mask coated substrate of FIG. 2 after etching of the substrate.

The mask layer 104 is etched to form mask layer strips 106, as shown in FIGS. 2 and 3. The substrate 102 is then etched around the mask layer strips 106 to form elongated mesas 108 with sidewalls 110, as shown in FIG. 4. Typical etching techniques include wet anisotropic etching with a solution of $KOH:H_2O$. A 40% KOH solution applied at 70° C. can achieve etch rates of 30 $\mu$m/hr. This type of etching is also known in the art as bulk micro-machining. With such an anisotropic etch, the sidewalls 110 are formed with the elongated mesas 108 which are sloped at an angle of about 54° with the horizontal.

Figure 5:
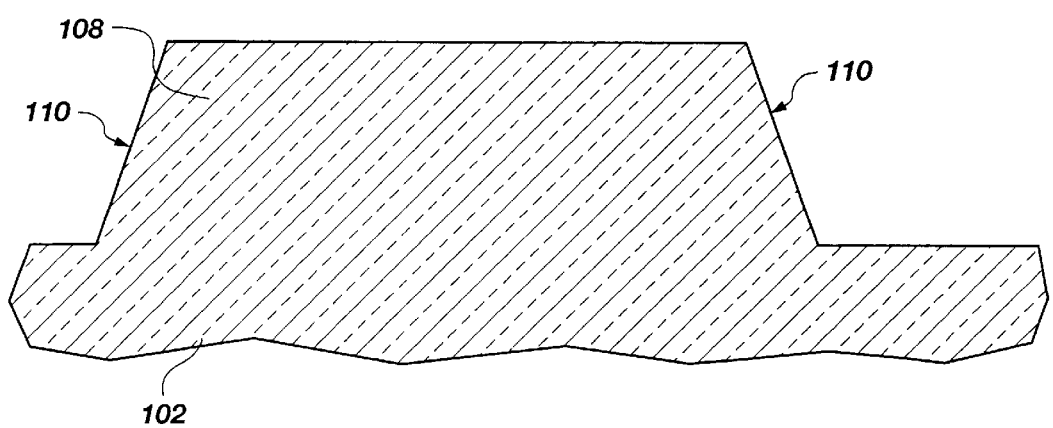
FIG. 5 is a side cross-sectional view of the etched substrate of FIG. 4 after removal of the mask strips.
Figure 6:
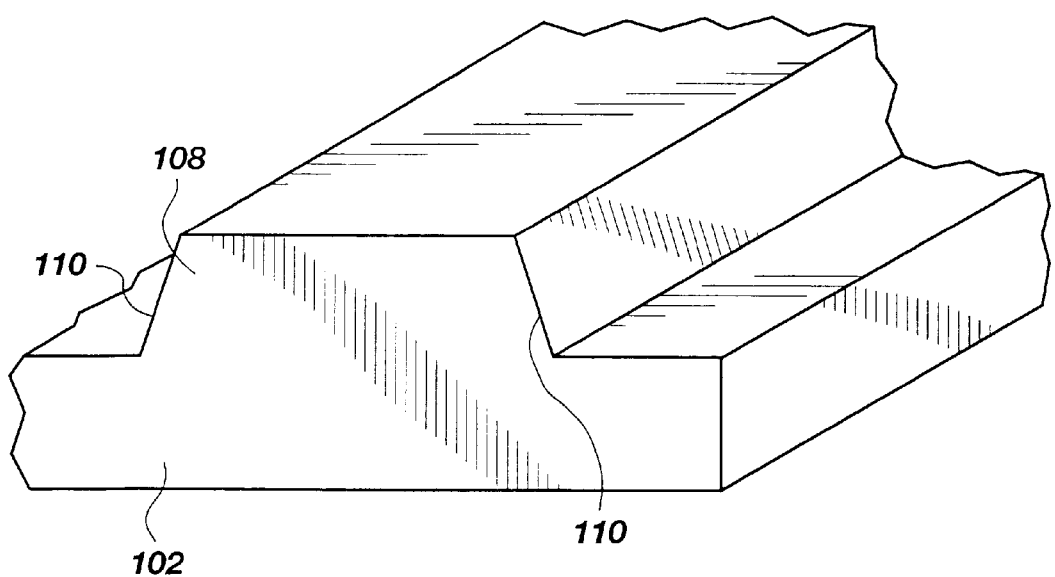
FIG. 6 is an oblique view of the etched substrate of FIG. 5.
Figure 7:
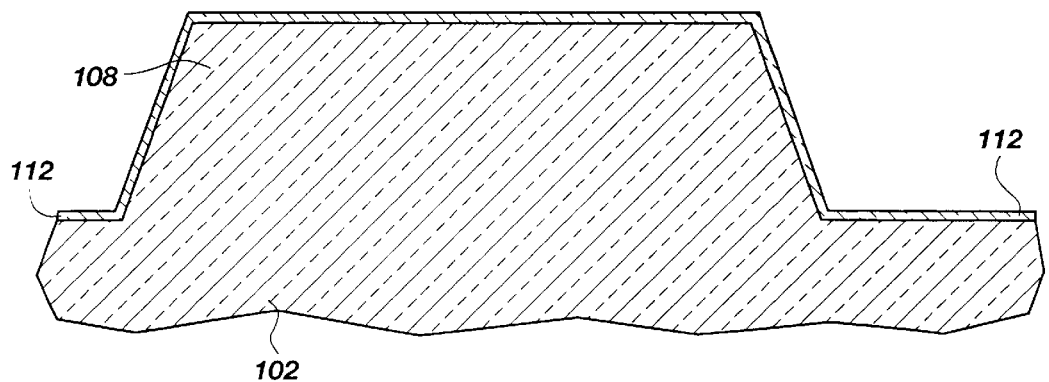
FIG. 7 is a side cross-sectional view of the etched substrate of FIG. 5 coated with an insulating layer.

As shown in FIGS. 5 and 6, the mask layer strips 106 are removed, preferably using a wet etch. For mask layer strips 106 formed of silicon nitride, an etchant such as $H_3PO_4$, that is selective to the substrate, can be used. An insulating or dielectric layer 112 is then formed on the substrate 102, including the elongated mesas 108 and the sidewalls 110, as shown in FIG. 7. The insulating layer 112 is preferably formed by oxidating the substrate 102 and may be accomplished by exposing the substrate 102 to an oxidizing atmosphere in a reaction chamber. Other techniques include deposition of silicon dioxide or silicon nitride by chemical vapor deposition (CVD), and injecting TEOS (tetraethylorthosilane) into the reaction chamber to grow silicon dioxide ($SiO_2$) at a temperature of about 400° C. Silicon dioxide is a preferred insulating layer 112 for its lower dielectric constant and consequently reduced capacitance, which results in increased speed of signal transmission in the overlying, subsequently-formed traces.

Figure 9:
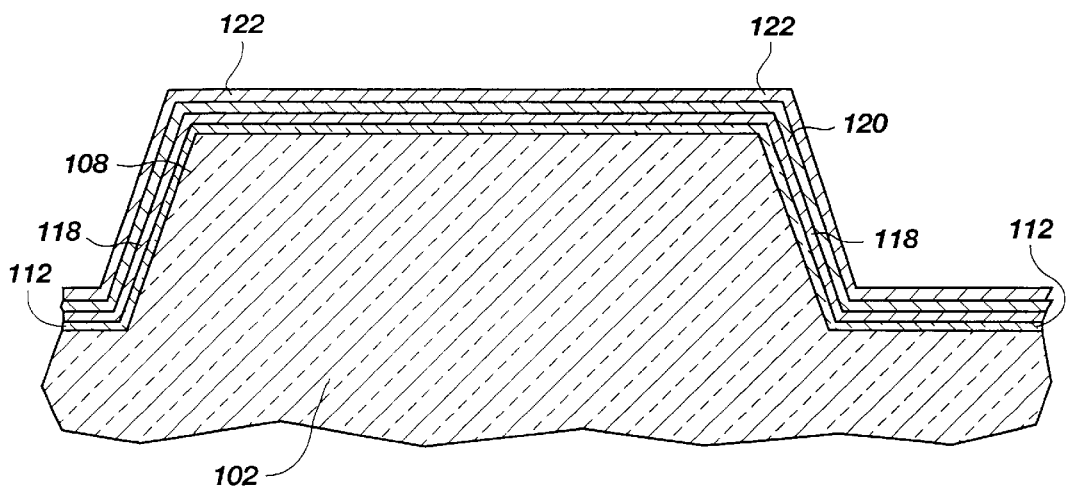
FIG. 9 is a side cross-sectional view of the insulated substrate of FIG. 6 with a multiple layer conductive coating.
Figure 8:
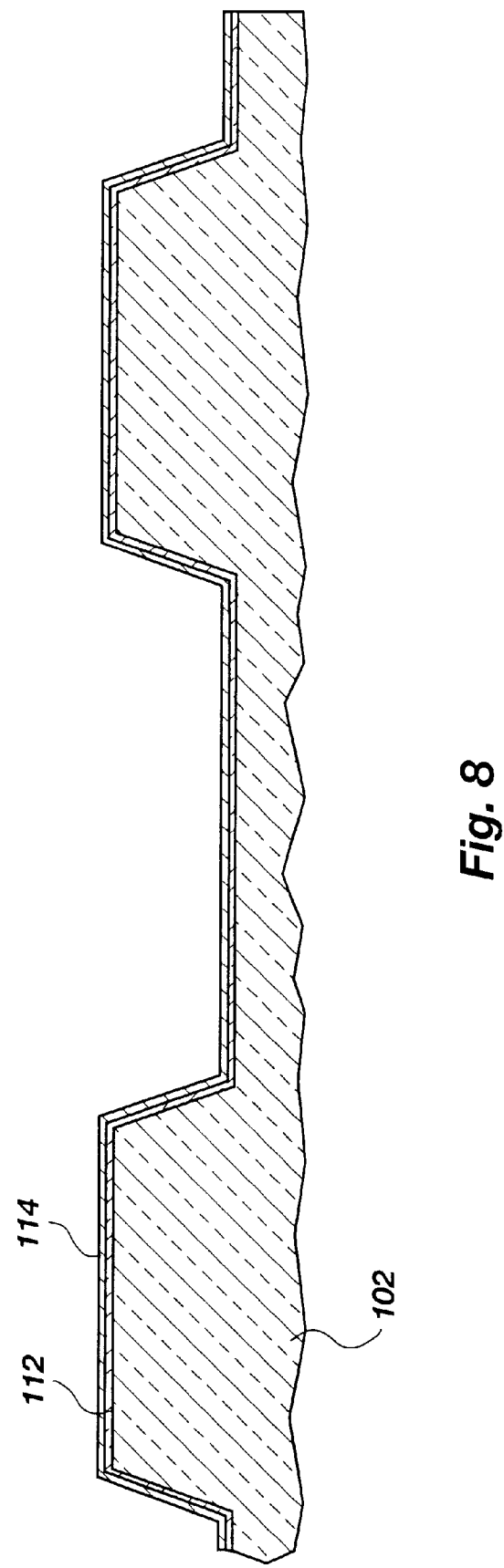
FIG. 8 is a side cross-sectional view of the insulated substrate of FIG. 6 with a conductive coating.

As shown in FIG. 8, a conductive material layer 114 is then formed on the insulating layer 112. The conductive material layer 114 can be any known, low resistivity material such as a metal, preferably palladium, tungsten, copper or aluminum. It can also be a stack of 2 or more metals, as noted below. When the semiconductor dice (not shown) to be attached are attached by lead/tin solder balls, the conductive material layer 114 is preferably comprised of multiple layers. Most preferably, as shown in FIG. 9, the multiple layers are a chrome layer 118 applied over the insulating layer 112, a middle layer of copper/chrome alloy 120, followed by an uppermost layer of copper 122. This multiple layer configuration provides both good adherence to the material of substrate 102 and an excellent wetting surface for the later attachment of the solder balls of semiconductor dice. Additionally, a fourth metal layer (not shown) of palladium or gold is occasionally placed atop the copper layer 122 to prevent oxidation of the copper. Furthermore, titanium or titanium/tungsten alloys may be used as alternatives to chrome, and nickel may be used as an alternative to copper.

Figure 10:
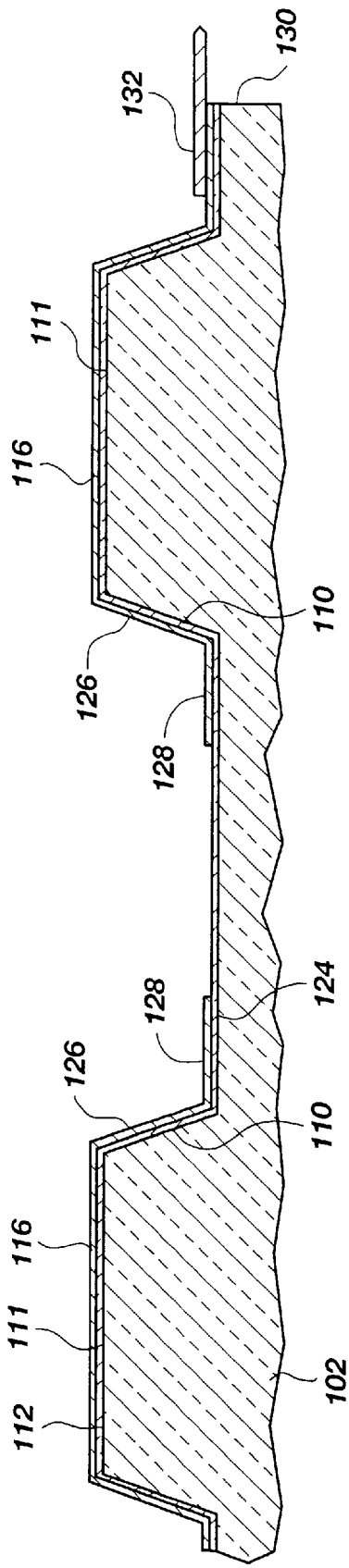
FIG. 10 is a side cross-sectional view of the conductively coated substrate of FIG. 8 after etching of the conductive coating to form conductive traces.

The conductive material layer 114 is then masked, patterned and etched to form conductive traces 116, as shown in FIG. 10. It is also understood that the conductive traces 116 can be formed by a number of alternate conventional techniques, such as: depositing a conductive paste on the substrate by silk screening the conductive traces 116 directly thereon; directly extruding a conductive paste to form the conductive traces 116; or applying a second insulating layer on the insulating layer 112, etching a trough in the second insulating layer, filling the trough with a conductive material, and removing the excess conductive material. The conductive traces 116 are preferably formed to include portions which extend over the mesas 108, up one sidewall 110, over the mesa top 111 and down the opposing mesa sidewall 110 onto the flat, etched portion 124 of the substrate 102 at chip mounting sites to form sidewall conductive trace terminal portions 126 and substrate conductive trace terminal portions 128, respectively.

Figure 11:
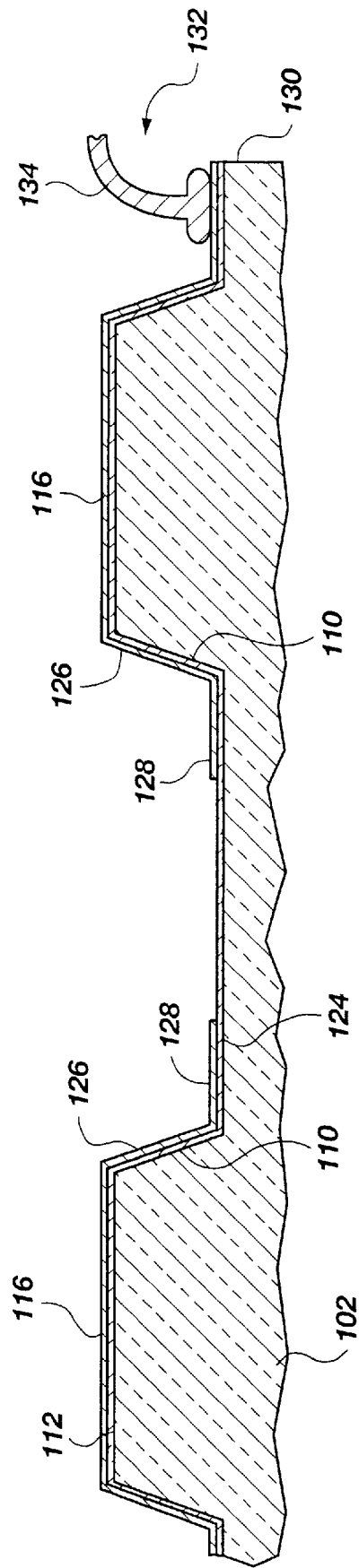
FIG. 11 is a side cross-sectional view of the conductive coated substrate of FIG. 8 after etching of the conductively coating to form conductive traces, bond wires being depicted to connect the conductive traces to external circuitry.
Figure 12:
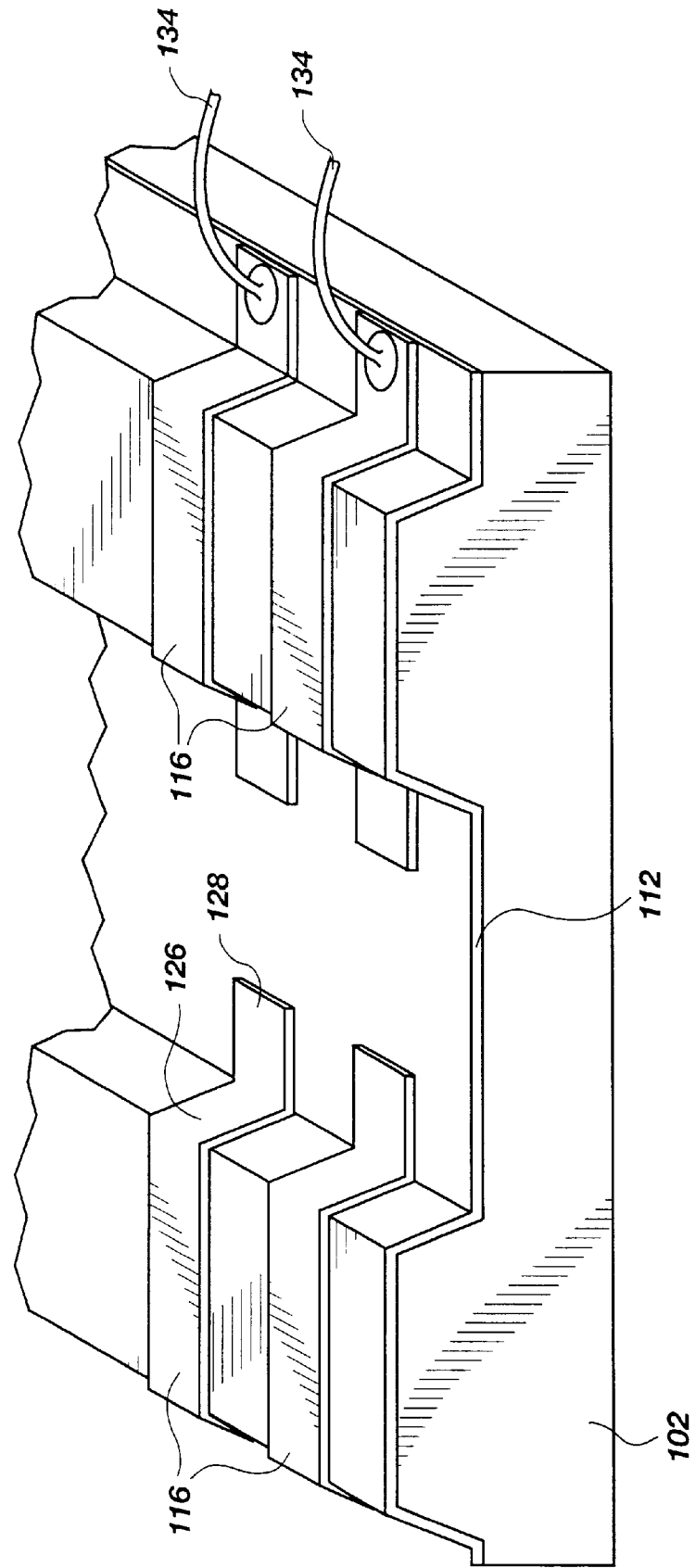
FIG. 12 is an oblique view of the conductively traced substrate of FIG. 11.
Figure 13:
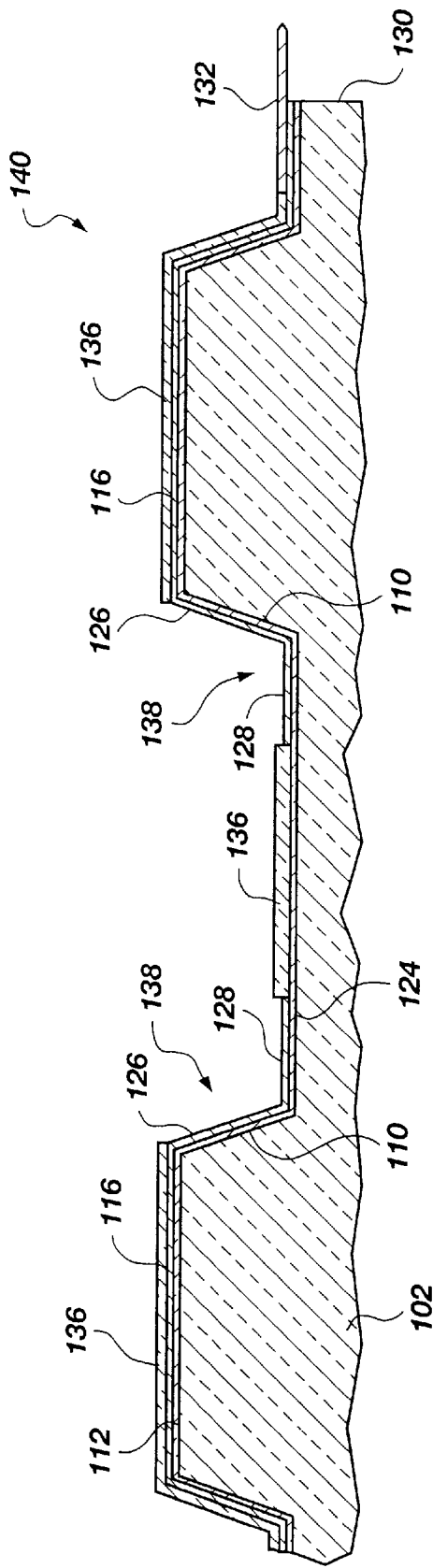
FIG. 13 is a side cross-sectional view of the conductive trace-bearing carrier substrate of FIG. 9 having select portions passivated.

Once the conductive traces 116 are formed, the conductive traces 116 may be brought into input/output communication with external circuitry (not shown) along a substrate edge 130, either before or after semiconductor elements are attached thereto. FIG. 10 schematically illustrates an external connector 132, such as a lead, wire bonded or TAB tape attachment, in electrical communication with the conductive trace 116 abutting the substrate edge 130. Preferably, the external connectors 132 comprise bond wires 134, as shown in FIG. 11. FIG. 12 illustrates an oblique view of the configuration shown in FIG. 11. It is understood that a different metal or uppermost metal layer (not shown) can be disposed on the conductive traces 116 near the substrate edge 130 to achieve a more effective site for bonding the external connector 132. The topmost metal can be also optimized for direct electrical connection to electrical pins or other contacts, such as are used for spring-biased or plug-in connections to higher-level packaging. A passivation layer 136 is optionally applied over the insulating layer 112 and conductive traces 116, and etched to expose contact areas 138 on the conductive traces 116, as shown in FIG. 13, to form a completed carrier substrate 140. If desired, the carrier substrate 140 may be edge-connected into a mating aperture in a carrier of a higher-level package, the aperture including conductive clips arranged to connect to contact areas 138.

Figure 14:
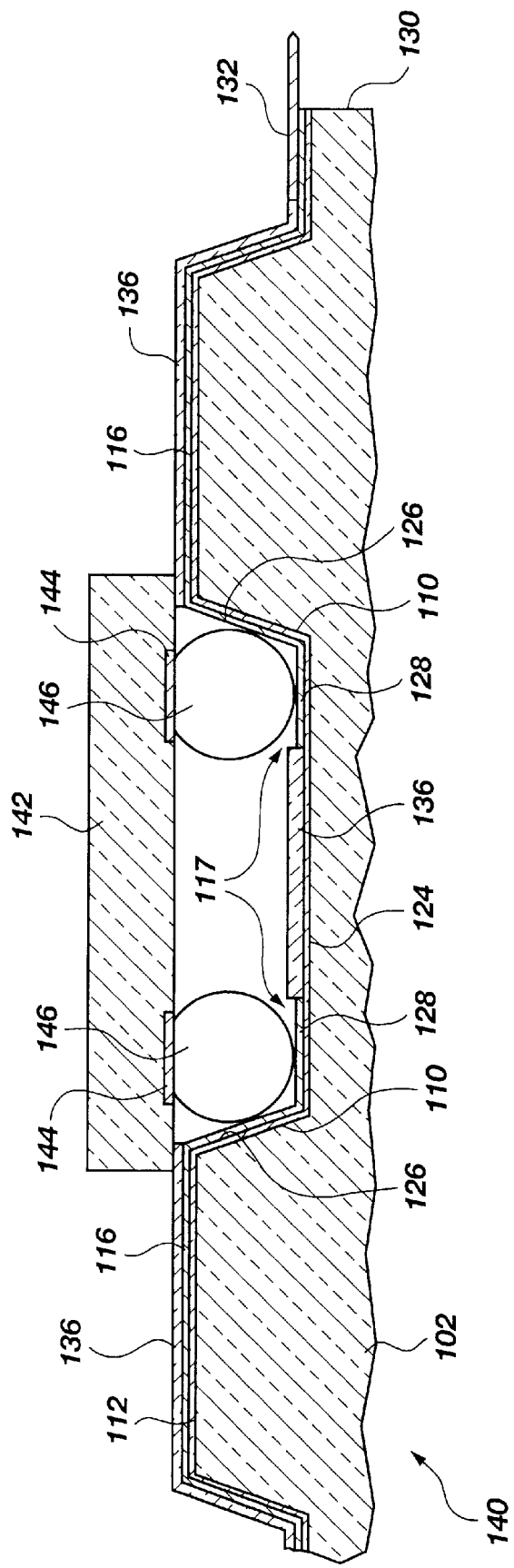
FIG. 14 is a side cross-sectional view of the passivated carrier substrate of FIG. 13 with a semiconductor element flip-chip attached.

The completed carrier substrate 140 may accept numerous semiconductor dice and/or circuitry-carrying wafer or partial wafer (as noted previously, "semiconductor element") configurations. FIG. 14 illustrates a conventional flip chip semiconductor element 142 attached to the carrier substrate 140. Typically, and in this instance, element 142 is only one of a plurality of flip-chips 142 carried by substrate 140 in a multi-chip module (MCM) assembly such as a SIMM, DIMM, or mother board. A plurality of bond pads 144 on the flip chip 142 achieves electrical contact with the conductive traces 116 via a plurality of conductive connectors 146, preferably lead/tin solder balls. The solder may be sputtered, stenciled, screen-printed, evaporated or plated on bond pads 144, and then reflowed to produce a surface tension-constrained ball shape. When lead/tin solder balls are used as conductive connectors 146, the solder balls are reflowed at about 230° C. Additionally, connections to the substrate may be enhanced by pre-placing a lead/tin solder paste at 117 on the exposed portions of conductive traces 116, which paste is formulated to reflow at a lower temperature than the solder balls. For example, a lead/tin eutectic paste which will liquify at a temperature of about 160–180° C. may be sputtered, evaporated, screen-printed, stenciled or plated on terminal areas of conductive traces 116. By heating to this temperature after placing flip-chips 142 on substrate 140, both permanent and temporary electrical contact therebetween can be made. The lead/tin eutectic paste, which liquifies at a lower temperature than the solder balls, may be employed to make a secure, temporary connection by heating the assembly to the lower temperature and then cooling to resolidify the paste, bonding the traces 116 to the solder balls. If a permanent connection is desired, a higher temperature may be employed to reflow the solder balls as well as the paste on the traces.

The conductive connectors 146 may be formed on either the flip chip 142 or the carrier substrate 140, as desired, the other element being configured with cooperative contacts. It is preferred, however, that conductive connectors be formed on flip chips 142. The conductive connectors 146 each preferably make contact with both the sidewall conductive trace portion 126 and the substrate conductive trace portion 128.

Figure 15:
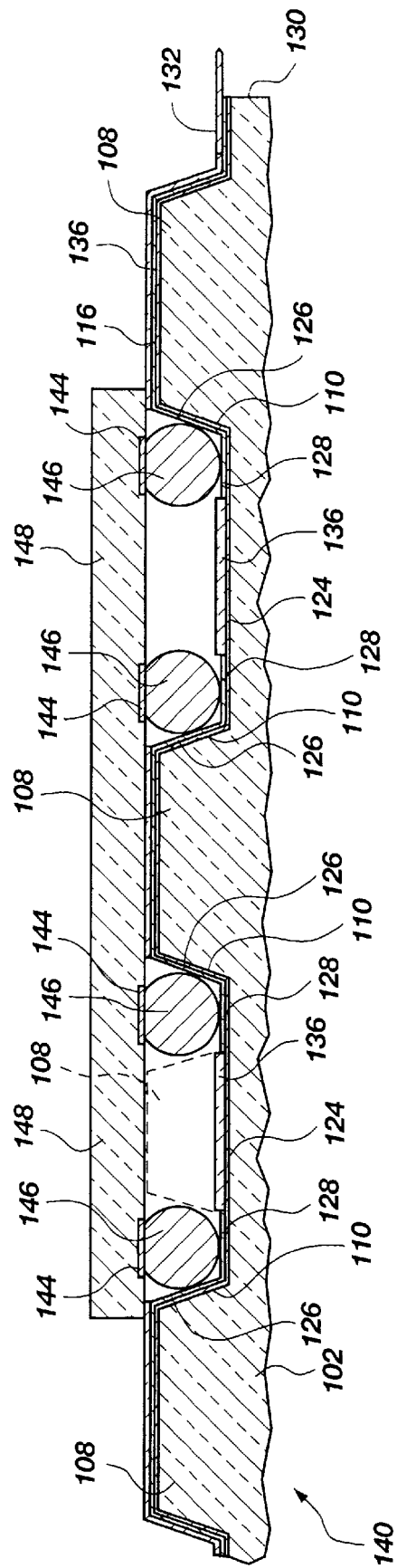
FIG. 15 is a side cross-sectional view of the passivated carrier substrate of FIG. 13 with a straddling semiconductor element flip-chip attached.

FIG. 15 illustrates a straddling semiconductor chip or other circuitry-bearing semiconductor element 148 which spans one or more elongated mesas 108 and makes electrical contact with the conductive traces 116 in a manner discussed above for FIG. 14. As shown in broken lines, mesas 108 may be formed a single connector-width apart to provide the previously-referenced triple surface contact area.

Figure 16:
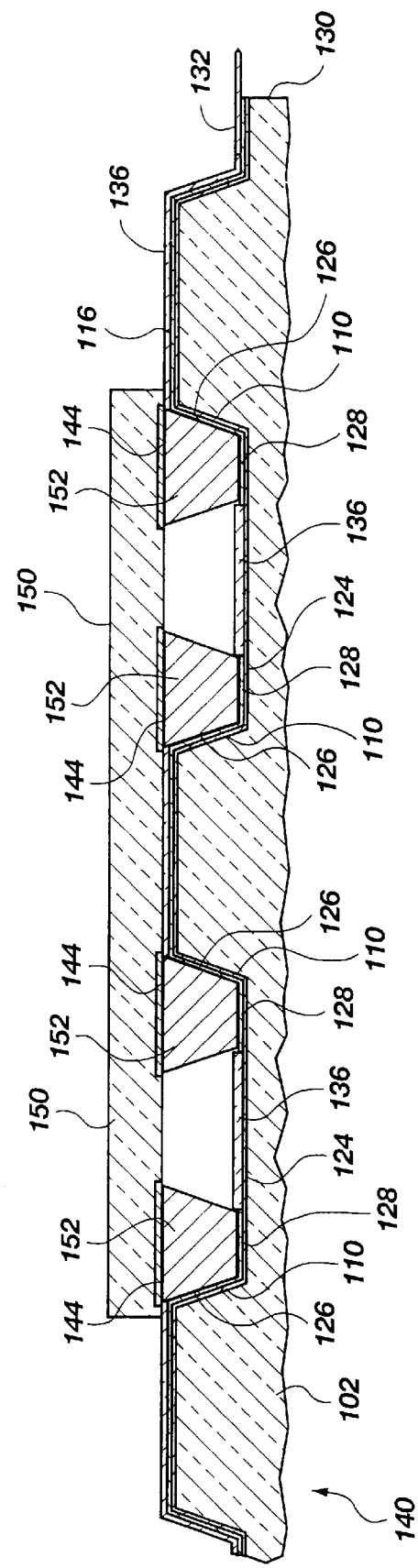
FIG. 16 is a side cross-sectional view of the passivated carrier substrate of FIG. 13 with an integrated circuitry-carrying, bond padded substrate attached.

FIG. 16 illustrates a semiconductor chip or integrated circuitry bearing element 150 with conductive connectors 152 designed to be angled to form a matched attachment to both the substrate conductive trace portion 128 and the sidewall conductive trace portion 126. The conductive connectors 152 are preferably lead/tin connectors of square wedge or frustoconical configuration. These conductive connectors 152 can be formed by sputtering or evaporating the conductive material, using conventional tin/lead solder compositions which liquify at about 230° C., or eutectic compositions which liquify at relatively low temperatures (about 160–180° C.), comprising about 63% by weight Pb and 37% by weight Sn, or by depositing the conductive material by stenciling, screen-printing, or plating the conductive material on top of conductive traces 116 on the carrier substrate 140 or on the bond pads 144 of the semiconductor chip 150. When the lead/tin connectors are formed by the above method, a single reflow during attachment of the semiconductor chip 150 to the carrier substrate 140 results in a simultaneous attachment and formation of a solder ball. As a further option, a dielectric layer of relatively great thickness may be formed on the active surface of the die or carrier substrate to define the bond pad and solder ball locations to eliminate the need for an underfill. Alternatively, the connectors may be printed or otherwise formed of a conductive or conductor-filled epoxy with sidewalls angled to match those of the mesas. Such connectors may comprise a so-called "B stage" epoxy which is partially curable after deposition on the semiconductor element to stabilize its structure, and subsequently completely curable to effect an adhesive connection to the substrate traces. As a further alternative, the conductive connectors may comprise conductive or conductor-filled thermoplastics. Non-conductive underfills between the substrate edge 130 and semiconductor chip 150 can also be employed to enhance the mechanical bond between the components and provide environmental protection in the electrical connections.

Figure 17:
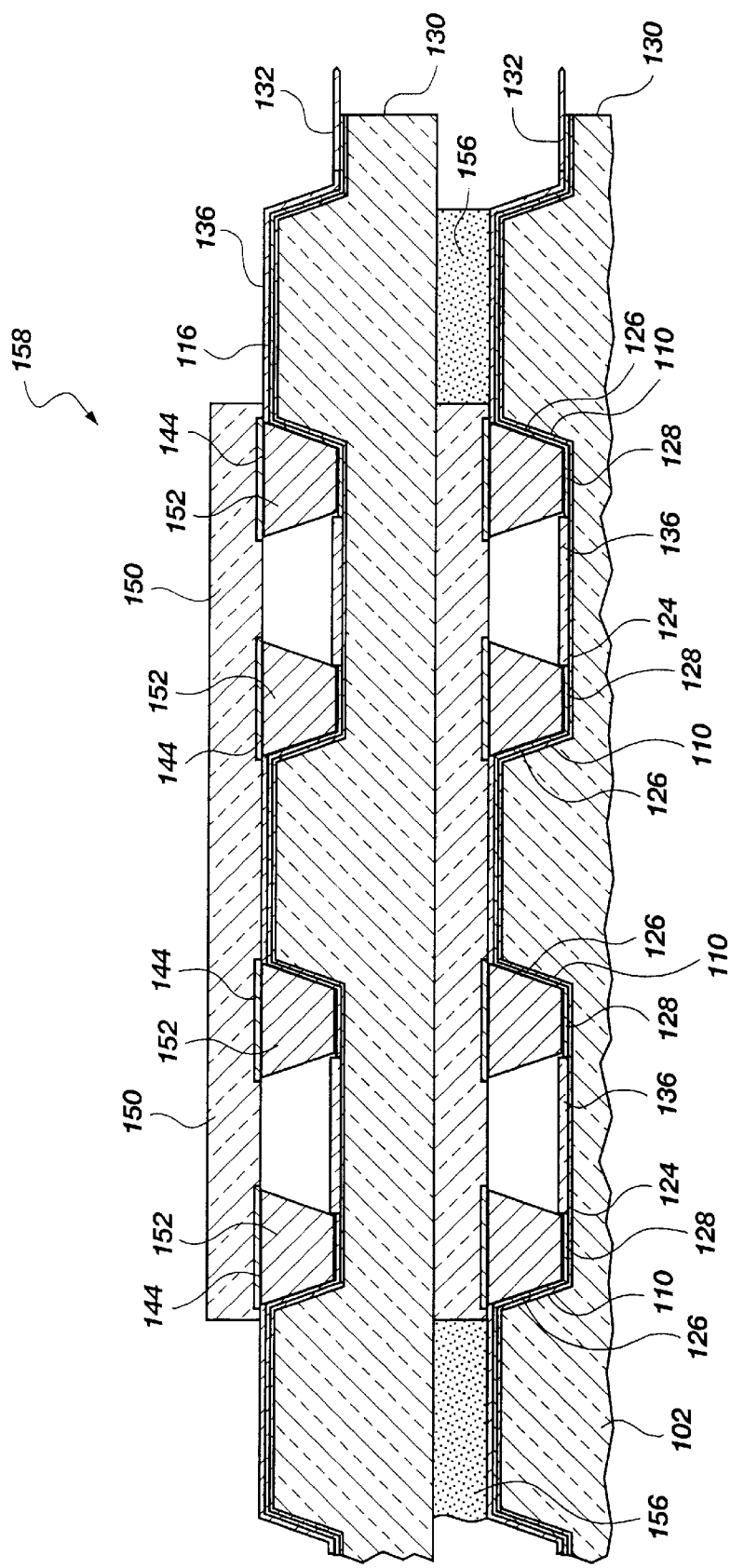
FIG. 17 is a side cross-sectional view of the passivated carrier substrate of FIG. 13 in a stacked configuration with other such semiconductor-element carrying substrates.

After attachment of one or more semiconductor chips 150, the carrier substrate 140 may be stacked with and attached to other semiconductor element-carrying substrates 140 with an adhesive 156, as shown in FIG. 17, to form a high density stacked configuration 158.

Figure 18:
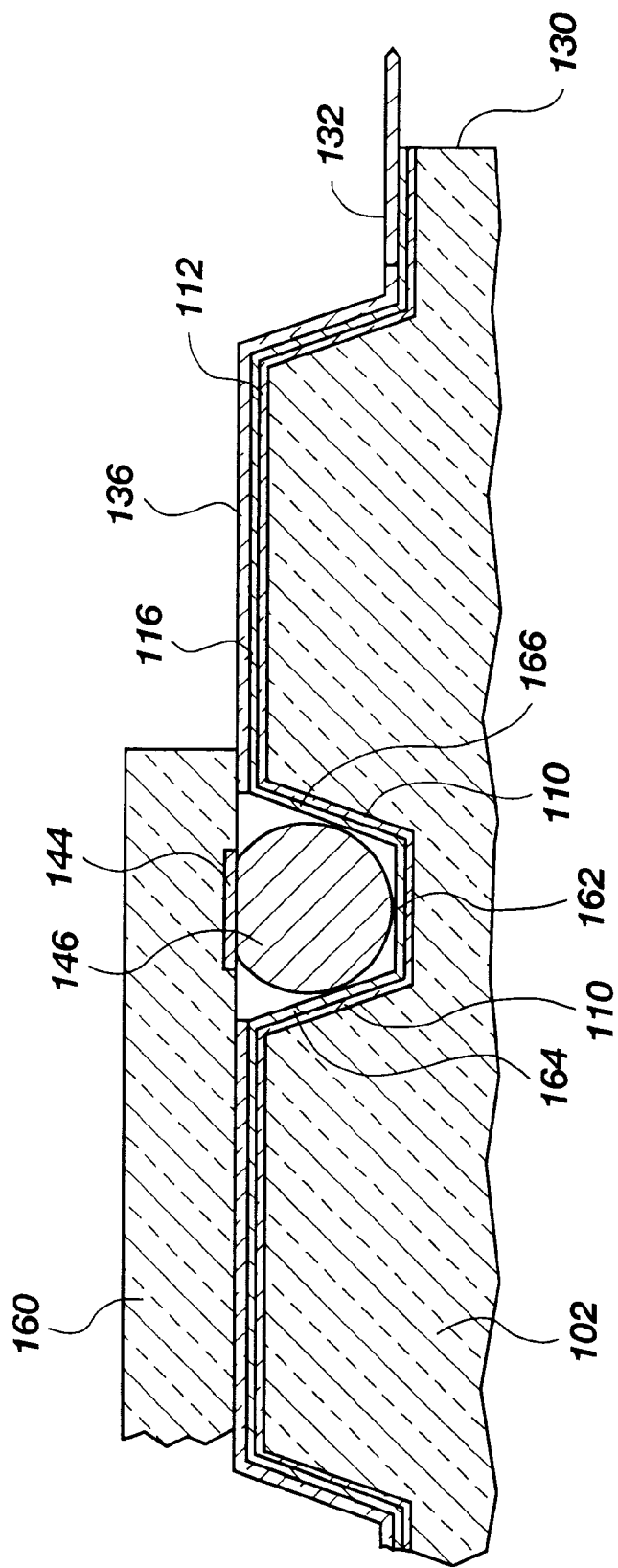
FIG. 18 is a side cross-sectional view of a passivated, closely spaced mesa configuration with a straddling semiconductor element attached.

FIG. 18 illustrates a closely spaced, elongated mesa configuration with a straddling semiconductor 160 attached. The elongated mesas 108 are spaced close enough together to make contact with three surfaces (i.e., a substrate etched portion 162, a first mesa sidewall surface 164, and a second mesa sidewall surface 166) of the conductive traces 116. However, such an arrangement may not be possible if the bond pad pitch (spacing) is too small.

Figure 19:
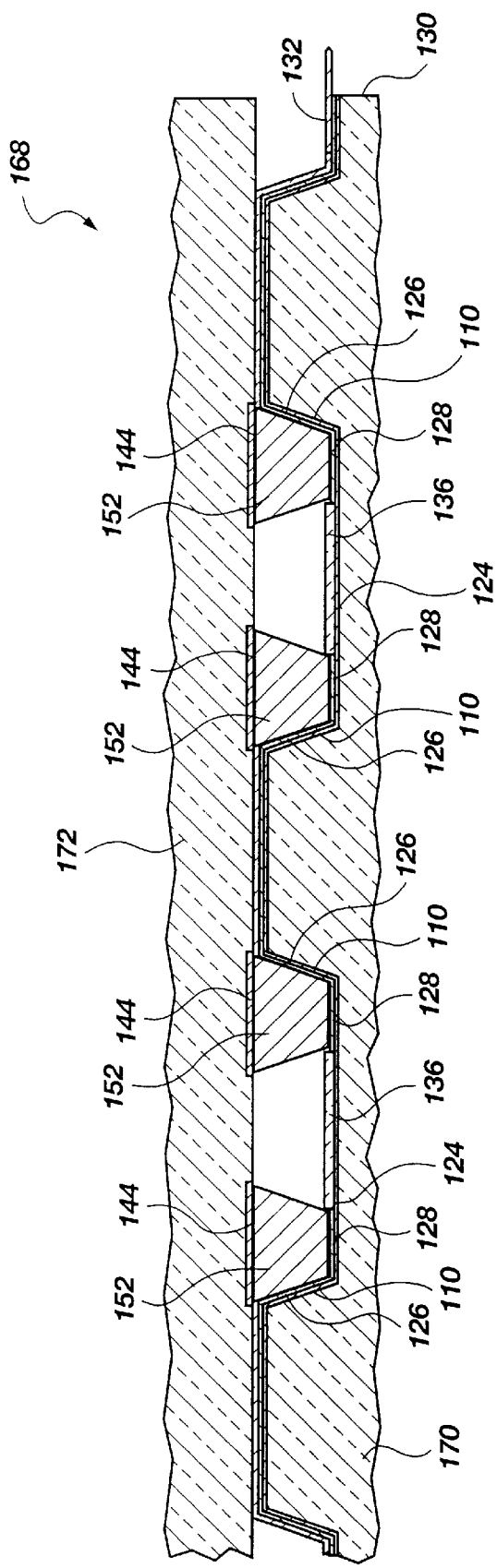
FIG. 19 is a side cross-sectional view of a wafer-to-wafer semiconductor element substrate arrangement.

FIG. 19 illustrates a wafer-to-wafer arrangement 168. The wafer-to-wafer arrangement 168 comprises a carrier substrate 170 formed from an entire silicon wafer attached, in a manner discussed above, to a semiconductor element 172 also formed from an entire wafer.

Figure 20:
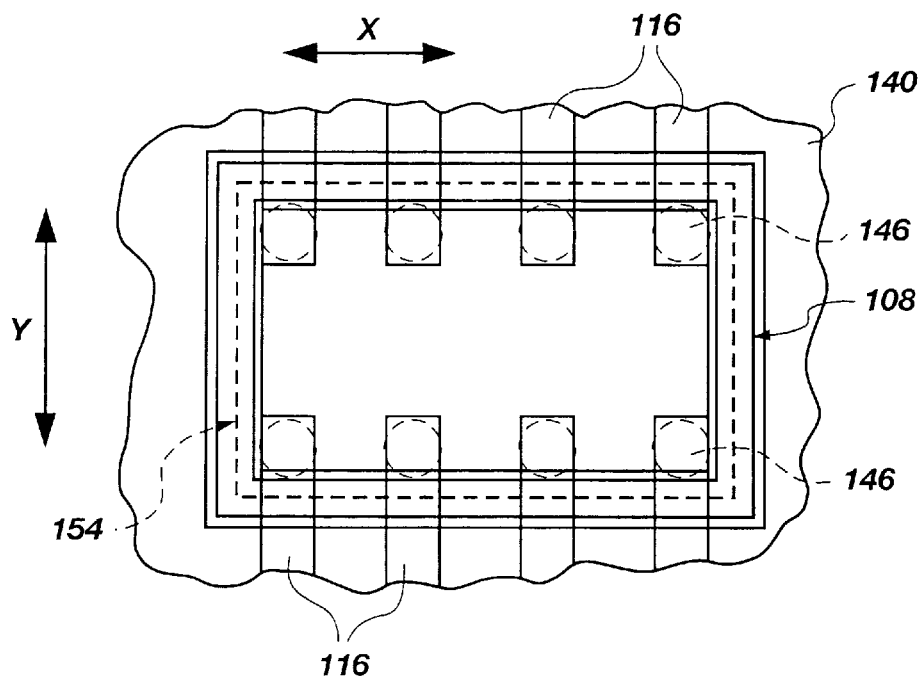
FIG. 20 is a top elevation of a box canyon mesa and conductive trace arrangement carrying a semiconductor element.

FIG. 20 illustrates the previously-noted "box canyon" arrangement of mesas 108 with conductive traces 116 extending thereover. Such an arrangement, if used with solder ball connectors 146, will result in automatic alignment of a semiconductor element 154 with the carrier substrate 140 in both X and Y directions upon solder reflow or, if conductive adhesive elements of precise placement, form and size are employed, during the assembly of the semiconductor element 154 with the carrier substrate 140, continued alignment being ensured by cure of the adhesive by heat, radiation, etc. as known in the art.

Figure 21:
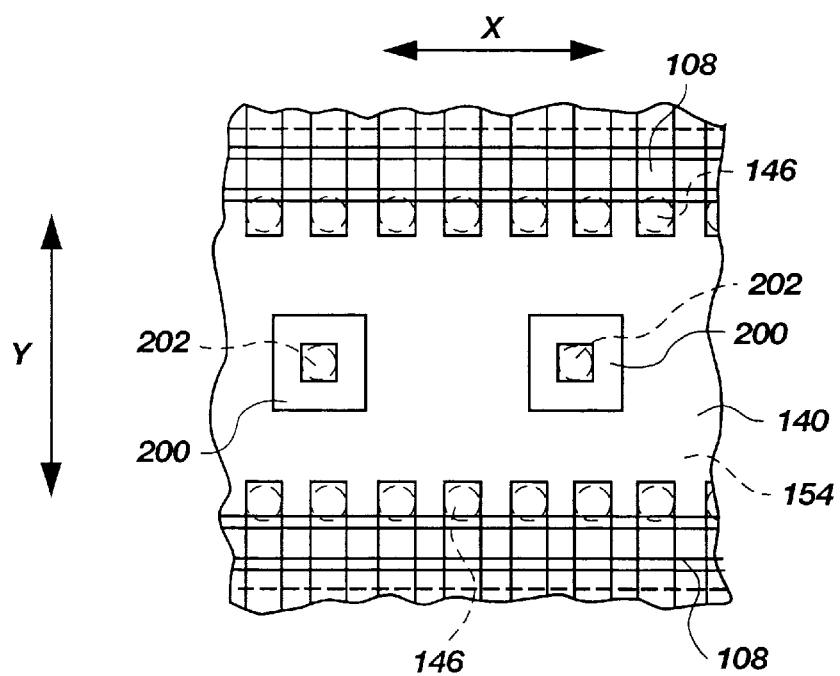
FIG. 21 is a top elevation of a carrier substrate bearing alignment boxes thereon for alignment of a semiconductor element therewith through engagement with alignment bumps or protrusions on the element.

FIG. 21 illustrates the use of two alignment boxes 200 formed on a carrier substrate 140, which may be mated with like-spaced alignment bumps or protrusions 202 on a semiconductor element 154 to be attached to substrate 140, in order to effect precise X-Y alignment during initial placement of the semiconductor element 154. Of course, only a single alignment box 200 may be employed to ensure alignment in one of the X-Y directions, with mesas 108 flanking the alignment box or boxes 200 ensuring alignment in the other direction by their contact with solder ball connectors 146. Such alignment boxes are formed at the same time as the mesas, using the same substractive techniques. However, there are no traces formed on or over the alignment boxes. Further, the alignment boxes may also comprise C-shaped structures, or even two parallel "tabs" extending from the carrier substrate, if alignment in only one direction is required, or two alignment boxes comprising an "L" or chevron shape may be employed to cooperate with two spaced alignment bumps on the semiconductor element.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A carrier substrate for a semiconductor element, comprising:

a substrate with a substantially planar surface having at least one elongated, substantially linear mesa defined by two inclined sidewalls rising therefrom and extending to a top surface substantially parallel to said substantially planar surface;

an insulating layer disposed over said substantially planar substrate surface and said at least one elongated substantially linear mesa; and a plurality of conductive traces extending over said insulating layer and including mutually parallel, laterally spaced, substantially linear segments oriented transversely to said at least one elongated, substantially linear mesa, said mutually parallel, laterally spaced, substantially linear segments of said plurality of conductive traces each extending over a first portion of said planar substrate surface on one side of said at least one elongated mesa, over said at least one elongated, substantially linear mesa and onto a second portion of said substantially planar substrate surface on an opposing side of said at least one elongated, substantially linear mesa.

2. The carrier substrate of claim 1, wherein said substrate is selected from a group consisting of monocrystalline silicon, silicon-on-glass, silicon-on-sapphire, germanium, and ceramic.

3. The carrier substrate of claim 1, wherein said insulating layer includes silicon dioxide.

4. The carrier substrate of claim 1, wherein said plurality of conductive traces includes copper.

5. The carrier substrate of claim 4, wherein said plurality of conductive traces further comprises a layer of chrome on said insulating layer, a layer of copper/chrome alloy on said chrome layer, and a layer of copper on said copper/chrome alloy layer.

6. The carrier substrate of claim 1, further comprising a passivation layer over said insulating layer and said plurality of conductive traces, said passivation layer including apertures therethrough exposing contact areas at predetermined locations on said plurality of conductive traces.

7. The carrier substrate of claim 1, wherein said at least one elongated mesa comprises a plurality of substantially parallel elongated mesas of similar length, and at least one of said plurality of conductive traces extends into an area between at least two of said plurality of substantially parallel elongated mesas after passing over at least one of said at least one elongated mesa.

8. The carrier substrate of claim 1, wherein said at least one elongated, substantially linear mesa comprises four elongated, substantially linear mesas substantially defining a rectangle bounding a substantially enclosed area into which said plurality of conductive traces extends after passing over at least one of said four elongated, substantially linear mesas.

9. The carrier substrate of claim 1, wherein said at least one elongated, substantially linear mesa comprises two substantially parallel, elongated, substantially linear mesas, and said plurality of conductive traces comprises two groups of traces, each of said two groups comprising a plurality of traces, each group of traces extending over a different one of said two substantially parallel, elongated, substantially linear mesas from a location remote from an area between said two substantially parallel, elongated, substantially linear mesas and terminating at a location on said substantially planar substrate element between said two substantially parallel, elongated, substantially linear mesas.

10. The carrier substrate of claim 9, wherein each trace of at least one of said two groups terminates between said two substantially parallel, elongated, substantially linear mesa along a common boundary parallel to the elongated, substantially linear mesa over which said plurality of traces of said at least one of said two groups extend.

11. The carrier substrate of claim 9, wherein at least some traces of said plurality of traces extend substantially to a peripheral edge of said substrate.

12. The carrier substrate of claim 1, further comprising a passivation layer covering said plurality of conductive traces and having apertures therethrough exposing portions of said plurality of conductive traces lying over said substantially planar substrate surface on said opposing side of said at least one elongated, substantially linear mesa and over a sidewall of said at least one elongated, substantially linear sidewall adjacent thereto.

13. The carrier substrate of claim 1, wherein said at least one elongated mesa comprises two mutually parallel elongated mesas, and at least one of said plurality of conductive traces extends from a location outside said two mutually parallel elongated mesas and over one of said two mutually parallel elongated mesas to an area between said two mutually parallel elongated mesas and at least partially up a sidewall of the second of said two mutually parallel elongated mesas.

14. The carrier substrate of claim 13, wherein said two mutually parallel elongated mesas are spaced apart by a distance substantially corresponding to a lateral dimension of conductive connectors of a flip-chip semiconductor element to be carried by said carrier substrate so that at least one of said conductive connectors will contact said at least one of said plurality of conductive traces over a sidewall of each of said two mutually parallel elongated mesas and over said substantially planar substrate surface therebetween.

15. The carrier substrate of claim 1, further comprising a layer of reflowable material disposed on said plurality of conductive traces at a location over said substantially planar substrate surface on said opposing side of said at least one elongated, substantially linear mesa and over an adjacent sidewall thereof.

16. The carrier substrate of claim 15, wherein said reflowable material comprises a solder material comprised substantially of tin and lead.

17. The carrier substrate of claim 1, wherein said substrate possesses a CTE substantially the same as that of a flip-chip configured semiconductor element to be carried thereon.

18. A semiconductor device, comprising:
a carrier substrate with a substantially planar surface having at least one elongated mesa defined by inclined sidewalls rising therefrom to a top substantially parallel to said substantially planar surface;
an insulating layer disposed over said substantially planar substrate surface and said at least one elongated mesa;
a plurality of conductive traces extending over said insulating layer and including mutually parallel, laterally spaced segments oriented transversely to said at least one elongated mesa, said plurality of mutually parallel, laterally spaced segments of said conductive traces each extending over a first portion of said substantially planar substrate surface on one side of said at least one elongated mesa, over said at least one elongated mesa and onto a second portion of said substantially planar substrate surface on an opposing side of said at least one elongated mesa; and
at least one semiconductor element having an active surface including a plurality of conductive connectors projecting transversely therefrom, each conductive connector of said plurality being in electrical contact with one of said plurality of conductive trace segments on a first area thereof located over a sidewall of said at least one elongated mesa and a second area thereof adjacent said first area and located over said substantially planar substrate surface.

19. The semiconductor device of claim 18, wherein said carrier substrate is selected from a group consisting of monocrystalline silicon, silicon-on-glass, silicon-on-sapphire, germanium, and ceramic.

20. The semiconductor device of claim 18, wherein said insulating layer includes silicon dioxide.

21. The semiconductor device of claim 18, wherein said plurality of conductive traces includes copper.

22. The semiconductor device of claim 21, wherein said plurality of conductive traces further comprises a layer of chrome on said insulating layer, a layer of copper/chrome alloy on said chrome layer, and a layer of copper on said copper/chrome alloy layer.

23. The semiconductor device of claim 18, further comprising a passivation layer over said insulating layer and said plurality of conductive traces, said passivation layer including apertures therethrough exposing contact areas over predetermined locations on said plurality of conductive traces.

24. The semiconductor device of claim 18, wherein said at least one semiconductor element includes a semiconductor chip.

25. The semiconductor device of claim 18, wherein said carrier substrate and said at least one semiconductor element each comprise an entire silicon wafer.

26. The semiconductor device of claim 18, wherein said at least one elongated mesa comprises at least two mutually parallel, adjacent elongated mesas, and further comprising at least one conductive trace extending down a sidewall of one of said at least two elongated mesas, onto said substantially planar substrate surface, and up a sidewall of another of said at least two elongated mesas; and wherein said at least one conductive connector of said plurality of conductive connectors is received between said one and said another of said at least two elongated mesas and electrically contacts said at least one conductive trace over said sidewall of said one of said at least two elongated mesas, over said substantially planar substrate surface, and over said sidewall of said another of said at least two elongated mesas.

27. The semiconductor device of claim 18, wherein said conductive connectors comprise balls of reflowable material.

28. The semiconductor device of claim 27, wherein said balls comprise a lead/tin alloy.

29. The semiconductor device of claim 18, wherein said at least some of said plurality of traces lying over said sidewall of said at least one elongated mesa are at least partially covered with a reflowable material compatible with a material of said plurality of conductive connectors.

30. The semiconductor device of claim 29, wherein said conductive connectors are comprised of a tin/lead composition having a first melting point, and said reflowable material comprises a tin/lead composition having a second, lower melting point.

31. The semiconductor device of claim 18, wherein said conductive connectors are comprised of a reflowable material.

32. The semiconductor device of claim 31, wherein said reflowable material comprises a tin/lead composition.

33. The semiconductor device of claim 18, wherein said conductive connectors comprise an epoxy.

34. The semiconductor device of claim 18, wherein said conductive connectors comprise a thermoplastic.

35. The semiconductor device of claim 18, wherein said plurality of conductive traces is substantially covered with a passivation layer in an area between said at least one semiconductor element and said carrier substrate, with the exception of areas of contact between said conductive connectors and said plurality of conductive traces.

* * * * *

UNITED STATES PATENT AND TRADEMARK OFFICE
CERTIFICATE OF CORRECTION

Page 1 of 3

PATENT NO : 6,040,618
DATED : March 21, 2000
INVENTOR(S) : Akram

It is certified that error appears in the above-identified patent and that said Letters Patent are hereby corrected as shown below:

On the title page, in "U.S. Patent Documents", second entry, "4/1970" should be changed to --3/1974--;

In "U.S. Patent Documents", after second entry, insert --3,942,245  3/1976  Jackson et al.--

| | | |
|---|---|---|
| | Column 1, line 17, | change "Chip On Board" to --Chip-on-board-- |
| | Column 1, lines 18-19, 20 (two occurrences), 21, 23, 24, 25, 29, 34, 38, | change "flip chip" to --flip-chip-- (keeping all present capitalizations) |
| | Column 3, lines 26-27, | change "low resistivity" to --low-resistivity-- |
| | Column 4, line 63, | after "scrapping" delete "of" |
| | Column 5, line 38, | change "conductive" to --conductively-- |
| | Column 5, line 39, | change "conductively" to --conductive-- |
| | Column 6, line 33, | change "micro-machining." to --micromachining.-- |
| | Column 6, line 57, | change "low resistivity" to --low-resistivity-- |
| | Column 7, lines 56 and 62, | change "flip chip" to --flip-chip-- |
| | Column 8, line 21, | change "flip chip" to --flip-chip-- |
| | Column 8, line 24, | change "flip chips" to --flip-chips-- |
| Claim 1, | Column 9, line 65, | after "surface" insert --of said substrate-- |
| Claim 1, | Column 10, line 12, | change "elongated mesa," to --elongated, substantially linear mesa,-- |

UNITED STATES PATENT AND TRADEMARK OFFICE
CERTIFICATE OF CORRECTION

PATENT NO : 6,040,618
DATED : March 21, 2000
INVENTOR(S) : Akram

It is certified that error appears in the above-identified patent and that said Letters Patent are hereby corrected as shown below:

| | | |
|---|---|---|
| Claim 7, | Column 10, line 36, | change "elongated mesa" to --elongated, substantially linear mesa-- |
| Claim 7, | Column 10, lines 40-41, | change "said at least one elongated mesa." to --said plurality of substantially parallel elongated mesas.-- |
| Claim 9, | Column 10, line 59, | change "planar substrate element" to --planar surface of said substrate-- |
| Claim 10, | Column 10, line 63, | change "mesa" to --mesas-- |
| Claim 10, | Column 10, line 66, | change "extend." to --extends.-- |
| Claim 12, | Column 11, line 7, | change "linear sidewall" to --linear mesa-- |
| Claim 13, | Column 11, line 10, | change "elongated mesa" to --elongated, substantially linear mesa-- |
| Claim 18, | Column 11, line 42, | after "top" insert --surface of said carrier substrate-- |
| Claim 18, | Column 11, line 49, | change "said plurality of mutually parallel," to --said mutually parallel,-- |
| Claim 18, | Column 11, line 50, | after "said" insert --plurality of-- |
| Claim 26, | Column 12, line 29, | after "wherein" delete "said" |
| Claim 29, | Column 12, line 41, | after "said" insert --one-- |
| Claim 29, | Column 12, line 42, | delete "at least some" at beginning of line and change "of traces lying" to --of conductive trace segments lying-- |

UNITED STATES PATENT AND TRADEMARK OFFICE
CERTIFICATE OF CORRECTION

PATENT NO : 6,040,618
DATED : March 21, 2000
INVENTOR(S) : Akram

It is certified that error appears in the above-identified patent and that said Letters Patent are hereby corrected as shown below:

| | |
|---|---|
| Claim 30, Column 12, line 47, | after "said" at end of line insert --plurality of-- |
| Claim 31, Column 12, line 52, | after "said" at end of line insert --plurality of-- |
| Claim 33, Column 12, line 57, | after "said" at end of line insert --plurality of-- |
| Claim 34, Column 12, line 59, | after "said" at end of line insert --plurality of-- |
| Claim 35, Column 12, line 65, | after "said" insert --plurality of-- |

Signed and Sealed this

Third Day of April, 2001

*Attest:*

NICHOLAS P. GODICI

*Attesting Officer*    *Acting Director of the United States Patent and Trademark Office*